(12) United States Patent
Lu et al.

(10) Patent No.: US 7,577,175 B2
(45) Date of Patent: Aug. 18, 2009

(54) STRUCTURE OF HIGH POWER EDGE EMISSION LASER DIODE

(75) Inventors: Tien-Chang Lu, Hsinchu (TW); Chyong-Hua Chen, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 12 days.

(21) Appl. No.: 11/987,431

(22) Filed: Nov. 30, 2007

(65) Prior Publication Data

US 2009/0016396 A1 Jan. 15, 2009

(30) Foreign Application Priority Data

Sep. 7, 2007 (TW) .............................. 96133414 A

(51) Int. Cl.
*H01S 5/00* (2006.01)
(52) U.S. Cl. ................................ 372/45.01; 372/43.01

(58) Field of Classification Search ............... 372/45.01
See application file for complete search history.

(56) References Cited

U.S. PATENT DOCUMENTS 5,850,411 A * 12/1998 Major et al. ........... 372/45.013
2009/0067797 A1 * 3/2009 Peale ........................ 385/131

* cited by examiner

*Primary Examiner*—Dung T Nguyen
(74) *Attorney, Agent, or Firm*—Rosenberg, Klein & Lee

(57) ABSTRACT

A structure of high power edge emission laser diode that has plural mode extension sublayers with a chirp periodic distribution is provided. The Near Field Pattern (NFP) is an L shape, and the high intensity portion is nicely overlapped with the multi quantum wells. Furthermore, the low intensity portion will extend to the n-type cladding as it can as possible. Accordingly, the optical power density on the mirror surface of the high power edge emission laser diode is lower down and the vertical divergence angle is decreased, so as to prolong its lifetime.

9 Claims, 5 Drawing Sheets

STRUCTURE OF HIGH POWER EDGE EMISSION LASER DIODE

BACKGROUND OF THE INVENTION

1. Field of the Invention

The present invention relates to a structure of a laser diode. More particularly, the present invention relates to a structure of a high power edge emission laser diode.

2. Description of the Prior Art

During the recent years, the society and economy are highly developed and the technology advances in many aspects of people's daily life, the Laser Diode (LD) is a key component for the optical storage, optical communication and medical laser. Because the market of low power LD applied for the optical storage reader is saturated gradually, the specification of LD goes toward the high power applications such as a rewritable optical storage reader, a communication pump LD with a wavelength of 980 nm, a green light pump LD with a wavelength of 808 nm, a full-color laser projector and a full-color projection television (TV) using the high power LD, which all of the aforementioned high power LDs need to have small size and long lifetime.

Normally, increasing the vertical mode size of the edge emission LD can lower the optical output power density to enhance the output power and narrow the vertical divergence angle. A small vertical divergence angle can reduce the coupling loss between the edge emission LD and the optical components to increase the input optical power of the receiving-end, so as to simplify the design of the optical devices.

A conventional technology is reducing the thickness of the confinement layer of the edge emission LD to lower down the optical power density on the mirror surface of the LD and reduce the divergence angle of the far field, but it will also lower the confinement factor ($\Gamma$) to make operation efficiency of the LD mirror surface decline at the same time.

Another conventional technology is to design the LD as asymmetric cladding layers and make the near field pattern incline towards the n-type cladding layer to reduce the optical absorption.

In order to further reduce the far field divergence angle, another conventional technology is to add a design of a mode extension layer. That means to add a high refraction index material near the active layer to make the light distribution confined near the active layer extend to the high refraction index layer. However, this method will significantly lower the confinement factor and easily deteriorate the far field pattern at the same time, and will furthermore cause a multi-mode oscillation and a kink phenomenon owing to the mutual switching.

SUMMARY OF THE INVENTION

To solve the aforementioned problems, one object of the present invention is to provide a structure of a high power edge emission laser diode that has plural mode extension sublayers with a chirp periodic distribution, and which Near Field Pattern (NFP) is an L shape and which high intensity portion is nicely overlapped with the multi quantum wells to obtain a good confinement factor. Furthermore, the low intensity portion will extend to the n-type cladding layer as it can as possible. Accordingly, the optical power density on the mirror surface of the high power edge emission laser diode is lowered down and the vertical divergence angle is decreased, so as to prolong its lifetime.

Another object of the present invention is to provide a structure of a high power edge emission laser diode with increased multi quantum wells to more easily obtain a single mode operation, a high confinement factor and a low optical power density on the mirror surface of the high power edge emission laser diode.

Another object of the present invention is to provide a structure of a high power edge emission laser diode which is a communication pump LD with a wavelength 980 nm or a green light pump LD with a wavelength 808 nm.

Another object of the present invention is to provide a structure of a high power edge emission laser diode which can be applied for a full-color projector or a full-color projection TV.

In accordance with the above objectives, one embodiment of the present invention is to provide a structure of a high power edge emission laser diode. The high power edge emission laser diode includes: an n-type substrate; an n-type cladding layer arranged on the n-type substrate; a plurality of mode extension sublayers arranged in a chirp periodic distribution pattern in the n-type cladding layer, wherein the refraction index of each mode extension sublayer is higher than that of the n-type cladding layer; and a period is defined as the distance between any two of the adjacent mode extension sublayers, wherein the mode extension sublayers have a plurality of periods and the periods increase or decrease gradually.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

Figure 1:
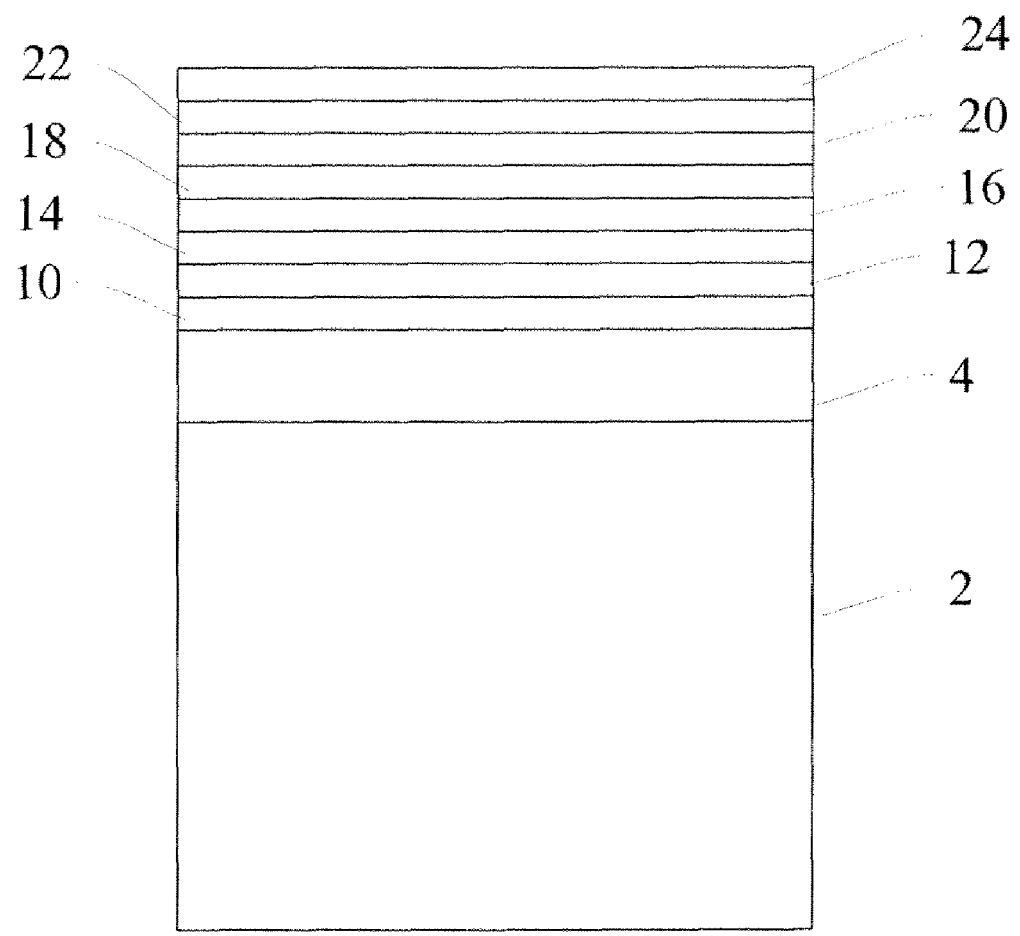
FIG. 1 is a schematic diagram of the cross-sectional view of a structure of a high power edge emission laser diode in accordance with one embodiment of the present invention.
Figure 2:
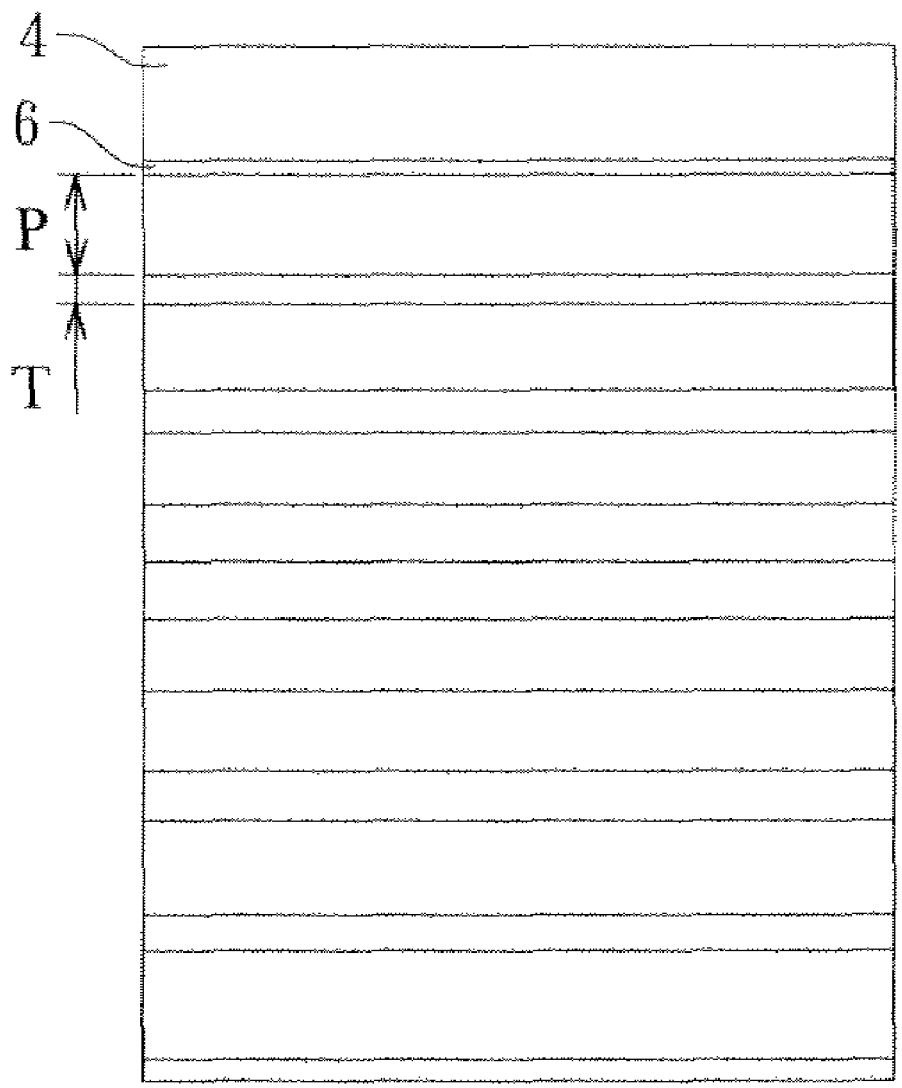
FIG. 2 is a schematic diagram of the cross-sectional view of a structure of a n-type cladding layer in accordance with one embodiment of the present invention.

FIG. 1 is a schematic diagram of the cross-sectional view of a structure of a high power edge emission laser diode in accordance with one embodiment of the present invention. On an n-type substrate 2 is orderly stacked an n-type cladding layer 4, a first light confinement layer 10, a multi quantum well layer 12, a second light confinement layer 14, a p-type inner cladding layer 16, an etching stop layer 18, a p-type outer cladding layer 20, a barrier reducing layer 22 and a p-type barrier reducing layer 24, wherein the n-type cladding layer 4 comprises a plurality of mode extension sublayers 6, as illustrated in FIG. 2. The refraction index of each mode extension sublayer 6 is higher than that of the n-type cladding layer 4 and the mode extension sublayers 6 are arranged in a chirp periodic distribution pattern in the n-type cladding layer. A period herein is defined as the distance (P) between any two of the adjacent mode extension sublayers, as illustrated in FIG. 2, wherein the plural mode extension sublayers 6 are periodically arranged and the periods increase or decrease gradually.

It is noted that the chirp periodic distribution also means the thicknesses of mode extension sublayers 6 increase or decrease gradually. When the periods increase/decrease gradually, the thicknesses (T) of the mode extension sublayers 6 decrease/increase gradually, accordingly. In the present embodiment illustrated in FIG. 2, the periods decrease gradually and then increase gradually from lower to up so that the thicknesses of mode extension sublayers 6 change, accordingly. In other embodiment, the periods may increase gradually and then decrease gradually, or the periods change periodically.

Figure 3:
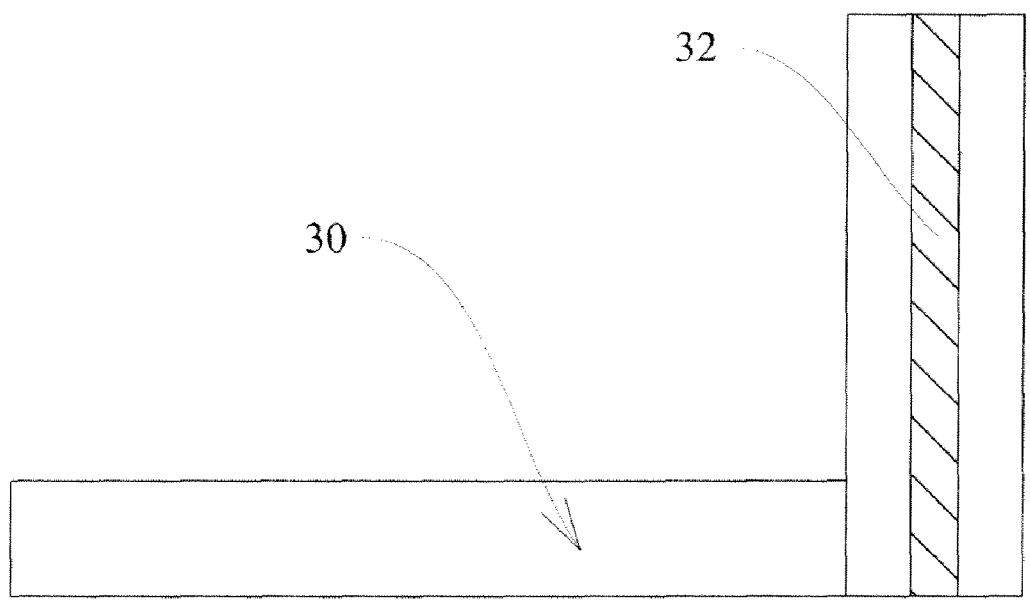
FIG. 3 is a schematic diagram of the near field pattern of a high power edge emission laser diode in accordance with one embodiment of the present invention.

FIG. 3 is a schematic diagram of the near field pattern of a high power edge emission laser diode in accordance with one embodiment of the present invention. The present invention of high power edge emission laser diode has plural mode extension sublayers with a chirp periodic distribution. The near field pattern is an L shape 30, and the high intensity portion is nicely overlapped with the multi quantum wells 32 to obtain a good confinement factor. Furthermore, the low intensity portion will extend to the n-type cladding as it can as possible. Accordingly, the optical power density on the mirror surface of the high power edge emission laser diode can be lowered down and the vertical divergence angle can be decreased, so as to prolong its lifetime.

Figures 4A, 4B:
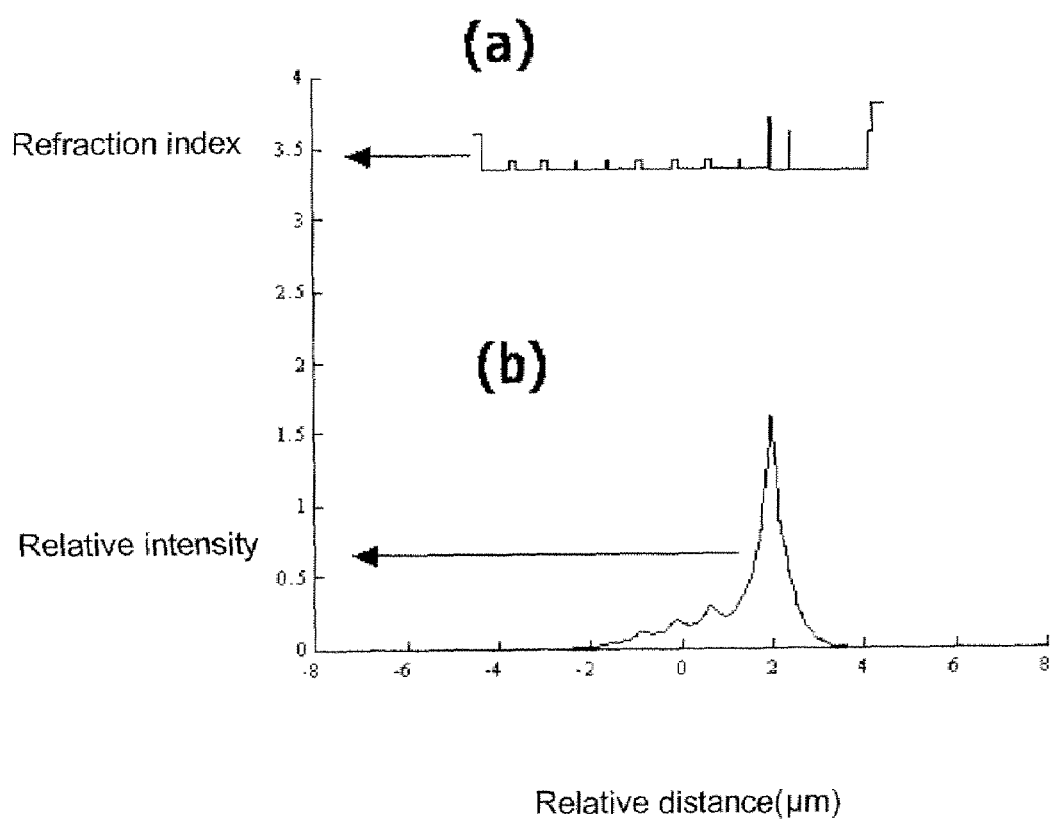
FIG. 4(a), FIG. 4(b) and FIG. 4(c) are respectively the schematic diagrams of the refraction index with a periodic distribution for the mode extension sublayers of a high power edge emission laser diode and the simulated far field pattern in accordance with one embodiment of the present invention.
Figure 4C:
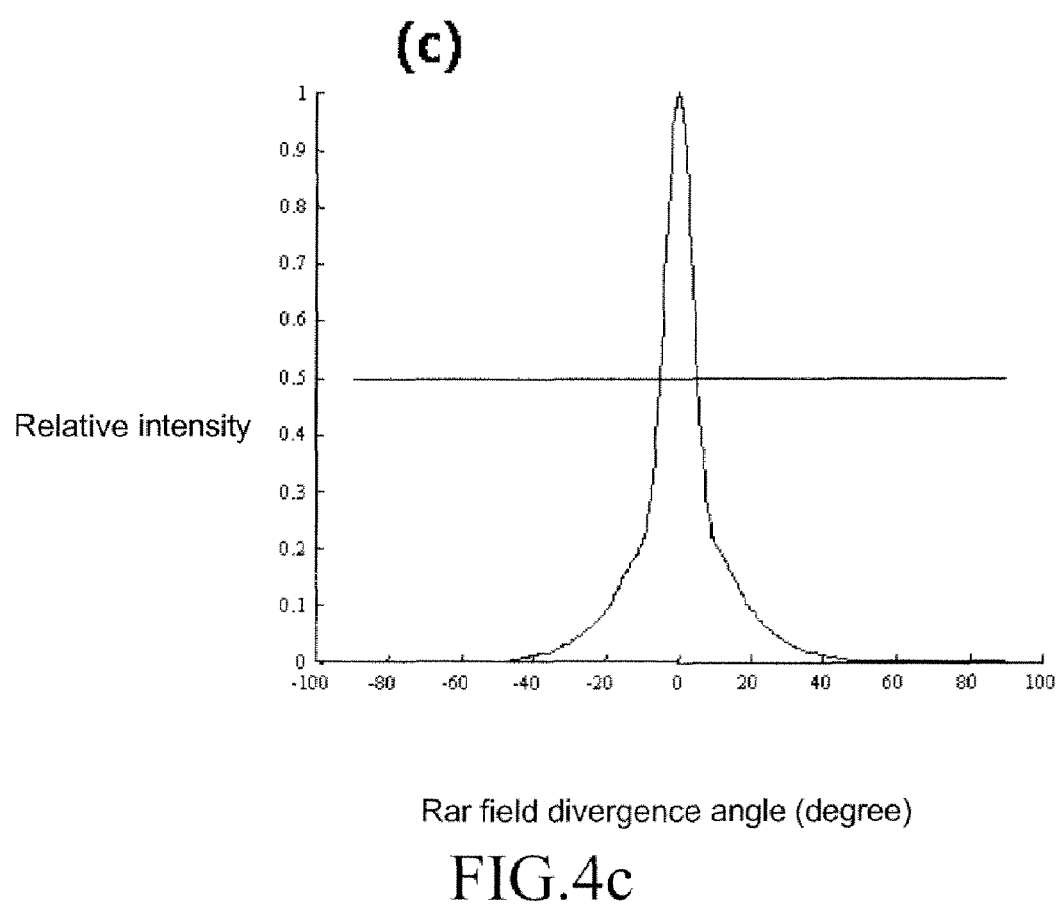

FIG. 4(a) is the refraction index distribution chart with a periodic distribution for the mode extension sublayers of a high power edge emission laser diode in accordance with one embodiment of the present invention. The multi quantum well layer has five quantum wells. The FIG. 4(b) and FIG. 4(c) are the schematic diagrams of the corresponding simulated far field pattern. FIG. 4(c) shows that the Full Width at Half Maximum (FWHM) significantly decreases but the confinement factor can still remain a high value.

The thickness of each mode extension sublayer for the embodiment shown in FIG. 4(a) is incompletely identical but the thickness of each mode extension sublayer can be identical or partially identical in another embodiment of the present invention.

In one embodiment of the present invention, the structure of the high power edge emission laser diode is fabricated by a Metal Organic Chemical Vapor Deposition (MOCVD) method or a Molecular Beam Epitaxy (MBE) method.

In one embodiment of the present invention, the material of the high power edge emission laser diode is gallium aluminum arsenide (AlGaAs), aluminum gallium indium phosphide (InGaAlP), gallium indium phosphorous arsenide (InGaAsP), aluminum gallium indium arsenide (InGaAlAs) or gallium aluminum indium nitride (InAlGaN).

In one embodiment of the present invention, the material of the mode extension sublayers of the high power edge emission laser diode is identical, incompletely identical or partially identical.

Besides, if the high power edge emission laser diode which has plural mode extension sublayers with a chirp periodic distribution according to the present invention increases the number of the multi quantum wells, the confinement factor can be increased tremendously and the optical power density on the mirror surface can be still remained low.

Hence, one characteristic of the high power edge emission laser diode of the present invention is to adopt plural mode extension sublayers with a chirp periodic distribution, thus the near field pattern can be formed an L shape. Therefore, it can obtain a good confinement factor to lower the optical power density on the mirror surface of the high power edge emission laser diode and prolong its lifetime. Moreover, if combining increasing the multi quantum walls, it can more easily obtain a high power edge emission laser diode with a single mode operation, a high confinement factor and a low optical power density on the mirror surface.

In one embodiment of the present invention, the structure of the high power edge emission laser diode can be applied for a communication pump laser diode with a wavelength of 980 nm or a green light pump laser diode with a wavelength of 808 nm.

In one embodiment of the present invention, the structure of the high power edge emission laser diode can be applied for a full-color laser projector or a full-color projection TV.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A structure of a high power edge emission laser diode, comprising:
    an n-type substrate;
    an n-type cladding layer arranged on the n-type substrate;
    a plurality of mode extension sublayers arranged in a chirp periodic distribution pattern in the n-type cladding layer, and the refraction index of each the mode extension sublayer is higher than that of the n-type cladding layer; and
    a period is defined as the distance between any two of the adjacent mode extension sublayers, wherein the mode extension sublayers have a plurality of periods and the periods increase or decrease gradually.

2. The structure of the high power edge emission laser diode according to claim 1, further comprising:
    a first light confinement layer arranged on the n-type cladding layer;
    a multi quantum well layer arranged on the first light confinement layer;
    a second light confinement layer arranged on the multi quantum well layer;
    a p-type inner cladding layer arranged on the second light confinement layer;
    an etching stop layer arranged on the p-type inner cladding layer;
    a p-type outer cladding layer arranged on the etching stop layer;
    a barrier reducing layer arranged on the p-type outer cladding layer; and
    a p-type contact layer arranged on the barrier reducing layer.

3. The structure of the high power edge emission laser diode according to claim 1, wherein the thickness of each mode extension sublayer is identical, incompletely identical or partially identical.

4. The structure of the high power edge emission laser diode according to claim 1, wherein the structure is fabricated by a metal organic chemical vapor deposition method or a molecular beam epitaxy method.

5. The structure of the high power edge emission laser diode according to claim 1, wherein the material of the structure is gallium aluminum arsenide, aluminum gallium indium phosphide, gallium indium phosphorous arsenide, aluminum gallium indium arsenide or gallium aluminum indium nitrides.

6. The structure of the high power edge emission laser diode according to claim 5, wherein the material of the mode extension sublayers is identical, incompletely identical or partially identical.

7. The structure of the high power edge emission laser diode according to claim 2, wherein the number of the multi quantum well layer is equal to or larger than five.

8. The structure of the high power edge emission laser diode according to claim 1, wherein the structure is applied for a pump laser diode with a wavelength of 980 nm or a green light pump laser diode with a wavelength of 808 nm.

9. The structure of the high power edge emission laser diode according to claim 1, wherein the structure is applied for a high power laser diode in a full-color laser projector or a full-color projection TV.

* * * * *